United States Patent [19]

Jackson

[11] Patent Number: 4,701,351

[45] Date of Patent: Oct. 20, 1987

[54] SEEDING PROCESS FOR ELECTROLESS METAL DEPOSITION

[75] Inventor: Robert L. Jackson, San Jose, Calif.

[73] Assignee: International Business Machines Corporation, Armonk, N.Y.

[21] Appl. No.: 874,976

[22] Filed: Jun. 16, 1986

[51] Int. Cl.[4] .......................... B05D 5/12; G03C 5/00
[52] U.S. Cl. ..................................... 427/98; 427/305; 427/385.5; 427/404; 430/315; 430/319; 430/324
[58] Field of Search ............... 430/313, 315, 319, 324; 427/98, 305, 385.5, 404, 407.1

[56] References Cited

U.S. PATENT DOCUMENTS

| 4,078,096 | 3/1978 | Redmond et al. | 427/98 |
| 4,112,139 | 9/1983 | Shirk et al. | 427/54 |
| 4,388,351 | 6/1983 | Sawyer | 427/304 |
| 4,517,254 | 5/1985 | Grapentin et al. | 428/626 |

Primary Examiner—John E. Kittle
Assistant Examiner—José G. Dees
Attorney, Agent, or Firm—Joseph G. Walsh

[57] ABSTRACT

A process for depositing and tightly binding noble metal seeds onto a substrate by coating the substrate with a very thin layer of a polymer which complexes with a noble metal compound and contacting the layer of polymer with a noble metal compound which forms a complex with the layer of polymer.

9 Claims, No Drawings

SEEDING PROCESS FOR ELECTROLESS METAL DEPOSITION

DESCRIPTION

1. Technical Field

The present invention is concerned with a process for depositing noble metal seeds on a substrate so that the substrate may subsequently be metal plated by an electroless process.

2. Background Art

U.S. Pat. No. 4,517,254 shows a process for the adhesive metallization of polyimide. Polyethylenimine is shown as one of a very large number of nitrogen compounds which can be used in an aqueous alkali hydroxide solution to pretreat the polyimide.

DISCLOSURE OF THE INVENTION

According to the present invention, a substrate is coated with a thin layer of a polymer having the ability to complex with a noble metal compound. This thin layer is preferably less than one micron thick. Examples of suitable polymers include polyamines, polyacids, and the salts of polyacids. The complexing polymer layer is applied preferably by dip-coating, spray-coating, or spin-coating from solution, or by a non-solution method such as plasma deposition. Seeding is accomplished by forming a complex between the polymer and a noble metal compound that is capable of catalyzing electroless metal plating or is capable of being converted into such a catalyst. The polymer serves to bind the noble metal compound tightly to the substrate. Preferred noble metal compounds include water soluble salts, such as palladium (II) chloride and palladium (II) sulfate, organic solvent soluble compounds, such as palladium (II) acetate, or volatile complexes, such as palladium acetylacetonate. Compounds of other metals such as copper, nickel, gold, platinum, and silver may also be used. The complex between the noble metal compound and the complexing polymer may be formed by adding the noble metal compound to a solution of the polymer, with the polymer applied to the substrate from this solution, or by applying the polymer to the substrate surface in one step and the noble metal compound in a separate step. Separate application of the noble metal compound is carried out preferably by dip-coating, spray-coating, or spin-coating from a solution of the noble metal compound or by exposure of the substrate to the vapor of the compound. Excess of the noble metal compound may be removed by washing in water or a solvent, or in the case of volatile noble metal compounds, by evacuation. Subsequently, the noble metal compound may be activated if necessary by a number of methods, including exposure to light, exposure to heat, exposure to a plasma, or exposure to a chemical reducing agent. In some cases, activation is not necessary. Metallization of the substrate is carried out by placing the substrate in an electroless plating bath, such as common baths used for plating copper and nickel.

Selective metallization of a substrate may be accomplished using a photoresist. This may be carried out by coating the substrate with the thin complexing polymer layer, and then subsequently coating the substrate with a photoresist, which is patternwise exposed and developed to define the areas to be metallized. The complexing polymer layer is uncovered, but is not otherwise disturbed, by the exposure and development process. The entire substrate is then coated with a noble metal compound. The compound binds to the complexing polymer, where it was uncovered as a result of the resist development process, but does not bind to the photoresist. The compound may thus be removed from the resist by washing in water or a solvent, or in the case of volatile noble metal compounds, by evacuation. Alternatively, the complex between the noble metal compound and the complexing polymer layer can be formed prior to application of the photoresist, either by applying the noble metal compound and the complexing polymer from a single solution or by applying them in separate steps. The complexing polymer layer thus serves not only to bind the noble metal compound to the substrate, but to define the selected areas of the substrate to be metallized by electroless plating. Subsequently, the noble metal compound is activated, if necessary, and the substrate is metallized in an electroless plating bath.

The process of the present invention is particularly applicable to electronic packaging substrates, especially circuit boards coated with permanent resists, i.e. resists that not only define the circuit lines but also remain on the board as part of the dielectric. At present, patterned electroless metal plating of printed circuit boards manufactured with permanent resists cannot be accomplished by normal procedures. Normally, seeders consisting of noble metal particles, such as palladium, are placed under the resist. The resist is exposed to define the circuit channels and the board is circuitized in the electroless deposition bath. Any excess seeder is removed from the bath after plating and stripping the resist. When the resist remains as part of the board, these metal particles also remain in the board as short circuit pathways. The present invention provides a method to circuitize a board prepared with a permanent resist by depositing seeds only in the bottom of the circuit channels after the resist is exposed and developed.

The following Examples illustrate some preferred processes for carrying out the present invention.

EXAMPLE 1

A clean circuit board substrate was dip-coated in a 0.05% by weight solution of 1,000,000 molecular weight polyacrylic acid. The substrate was dried at room temperature and finally at 100 degrees C. The substrate was then coated with a permanent resist which was exposed and spray developed in 1,1,1 trichloroethane. Thereafter, the substrate was dipped into a 1% by weight solution of aqueous sodium hydroxide, rinsed in deionized water, dipped into a 2% by weight aqueous solution of palladium (II) sulfate, and then rinsed again in deionized water. Electroless copper plating was then carried out without pre-reduction of the palladium (II) to palladium metal. Plating was accomplished in an aqueous, operating (steady state) electroless copper plating bath containing 2.5 g/l copper, 40 g/l EDTA, and 0.5 g/l formaldehyde; the bath was operated at a pH of 11.7 and a temperature of 70-75 degrees C. The copper deposited selectively and uniformly in the desired areas.

EXAMPLE 2

A clean circuit board substrate was dip-coated in a 2.6% by weight aqueous solution of 325,000 molecular weight poly(acrylic acid sodium salt). The substrate was dried at room temperature and finally at 100 degrees C. The board was then coated with a commercial dry-film circuit board resist which was exposed and spray developed in 1,1,1 trichloroethane. Subsequently, the substrate was dipped into an aqueous solution containing 2% by weight $PdCl_2$ and 1.3% by weight NaCl. After rinsing off the excess $PdCl_2$/NaCl, the substrate was electrolessly plated with copper, without pre-reduction of the palladium (II) to palladium metal, in the copper electroless plating bath described in Example 1. Deposition of copper proceeded with excellent selectivity and uniformity in the desired areas. After copper deposition was complete, the resist was stripped away in dichloromethane and the board was rinsed in hot deionized water to remove excess poly(acrylic acid sodium salt).

EXAMPLE 3

A clean ceramic packaging substrate was spin-coated with an aqueous solution containing 2.0% by weight of 325,000 molecular weight poly(acrylic acid sodium salt) and 2.0% by weight $PdSO_4$. The substrate was dried at 100 degrees C. The dry substrate was coated with a resist, which was exposed and developed. The substrate was then electrolessly plated with copper, without pre-reduction of the palladium (II) to palladium metal, in the electroless copper plating bath described in Example 1. Deposition proceeded with excellent selectivity and uniformity. After copper deposition was complete, the resist was stripped and the substrate was rinsed in hot deionized water to remove excess poly(acrylic acid sodium salt) and $PdSO_4$.

EXAMPLE 4

A clean circuit board substrate was dip-coated in a 2% by weight aqueous solution of 12,00 molecular weight polyethylenimine. The substrate was then coated with a permanent resist, which was exposed and spray developed in 1,1,1 trichloroethane. The substrate was then dipped into an aqueous solution containing palladium (II) chloride and HCl. A 2.5% solution of palladium (II) chloride by weight was used. When a more active electroless copper plating bath was used, only 0.3% palladium (II) chloride by weight was required. In each case, the molar concentration of HCl in the aqueous coating solution was roughly twice the molar concentration of palladium (II) chloride. After a water rinse to remove unbound palladium (II) chloride, reduction of palladium (II) to palladium metal was achieved by dipping the substrate in a 0.2 M solution of aqueous formaldehyde at a pH of 12.8. The substrate was then electrolessly plated with copper. The substrate seeded in the higher concentration palladium (II) chloride bath was plated in the electroless copper plating bath described in Example 1. The substrate seeded in the lower concentration palladium (II) chloride bath was plated in an aqueous electroless copper plating bath containing 2.5 g/l copper and 5.5 g/l formaldehyde; the bath was operated at a pH of 12.8 and a temperature of 23 degrees C. Excellent selectivity was obtained via this method in either electroless copper deposition bath. Copper deposited uniformly in the areas where the resist had been removed, while copper did not deposit on the resist surface.

As illustrated in Examples 1–3, the reduction step is not necessary in some cases, since Pd (II) is an active initiator for electroless copper deposition in most plating baths. This is because the basic formaldehyde contained in these baths reduces palladium (II) to palladium metal very rapidly.

This process has a number of advantages over the normal seeding approach especially for circuit boards manufactured with a permanent resist. It ensures that neither metals nor electrolytes will be incorporated into the dielectric, since only polymeric materials are placed under the resist. The polymer can be chosen to enhance the adhesion of the dielectric layers to one another and of the dielectric layer to the copper lines, thereby improving the overall quality of the board. The method is also applicable to plating of high aspect ratio holes, since the polymer coating can be applied to the surface of holes as well as to the surface of the board.

The present invention has other advantages over traditional noble metal particle seeders. Traditional seeders are applied as colloids, and can therefore form large clumps of particles that become defects in the final plated coating. Colloidal seeders can also be difficult to make reproducibly. In the method described here, the noble metal seeder is applied as a single phase solution or as a vapor, eliminating problems inherent in appplying or making colloidal seeders. Traditional seeders also require an acceleration step to remove oxides from the surface of the metal particles just prior to electroless metal plating. After acceleration, the substrate must be plated before the oxides can re-form. In the method described here, accelerators are not necessary since the seeder is not masked by an oxide coating. As a result, seeded substrates can stand indefinitely prior to plating without re-activation or acceleration.

I claim:
1. A process for depositing and tightly binding noble metal seeds onto a substrate, said process being characterized by the steps of:
    (1) coating the substrate with a thin layer less than 1 micron thick of a polyamine, polyacid or salt of a polyacid polymer which complexes with a noble metal compound, and
    (2) contacting said layer of polymer with a noble metal compound which forms a complex with the layer of polymer.
2. A process as claimed in claim 1 wherein the noble metal complex is subsequently activated to form metal particles.
3. A process as claimed in claim 1 wherein the substrate is subsequently placed in a copper electroless plating bath.
4. A process as claimed in claim 1 wherein the noble metal is palladium (II) chloride, palladium (II) sulfate, or palladium (II) acetylacetonate.
5. A process as claimed in claim 1 wherein the substrate is an electronic packaging substrate.
6. A process as claimed in claim 1 wherein the substrate is a circuit board.
7. A process for depositing and tightly binding noble metal seeds in a pattern onto a substrate, said process being characterized by the steps of:
    (1) coating the substrate with a thin layer less than 1 micron thick of a polyamine, polyacid or salt of a polyacid polymer which complexes with a noble metal compound,
    (2) overcoating said thin polymer layer with a photoresist,
    (3) patternwise exposing and developing the photoresist to define the pattern to be metallized, and
    (4) coating the substrate with a noble metal compound which selectively forms a complex with the thin polymer layer and not with the photoresist.
8. A process as claimed in claim 7 wherein the noble metal is complexed with the thin polymer lay prior to coating the substrate with the photoresist.
9. A process as claimed in claim 7 wherein the photoresist is a permanent resist.

* * * * *